Figure 6:
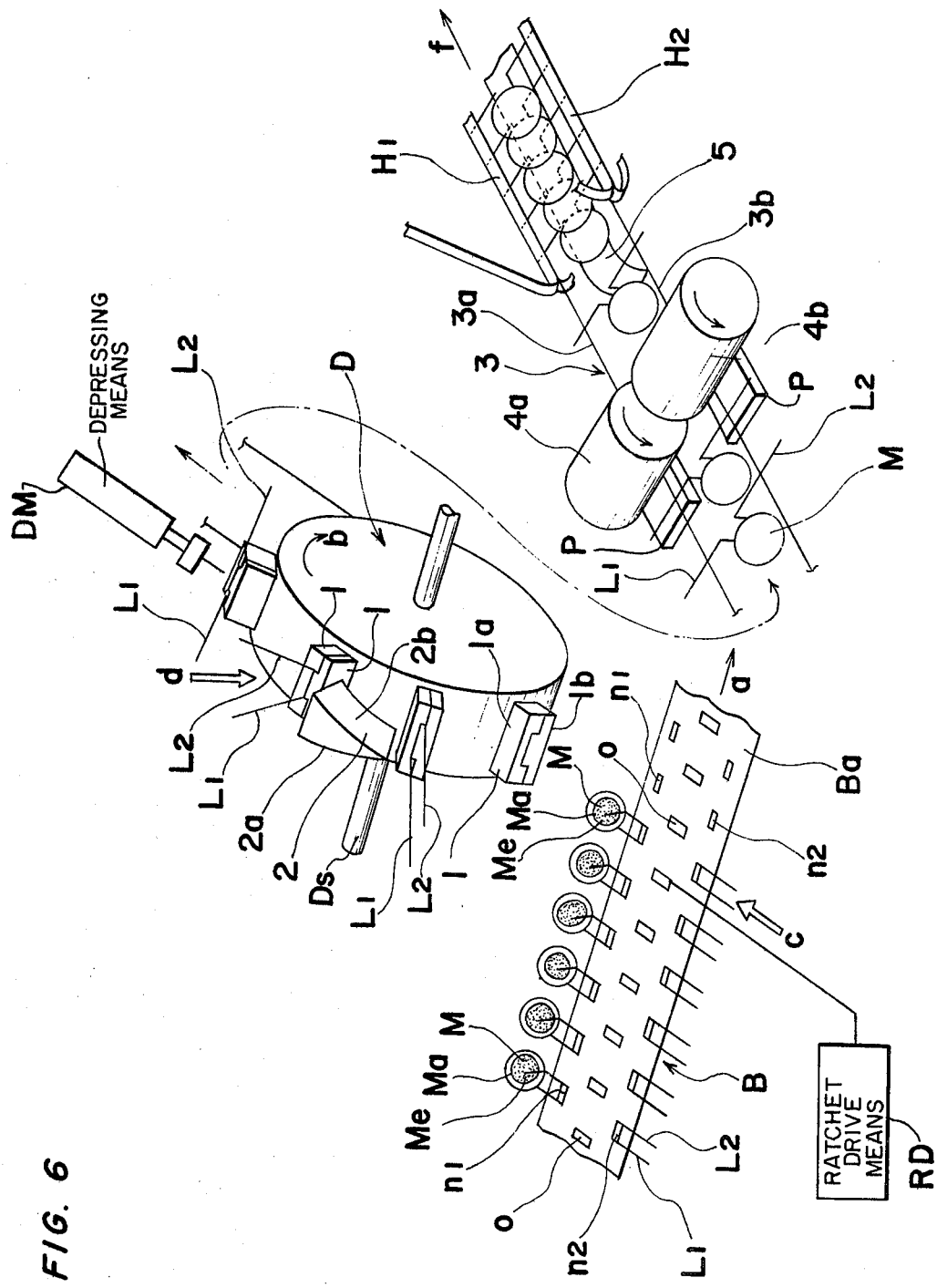

United States Patent [19]

Hamuro et al.

[11] 4,077,439
[45] Mar. 7, 1978

[54] FIXING DEVICE FOR ELECTRICAL AND ELECTRONIC COMPONENTS

[75] Inventors: Mituro Hamuro, Nagaokakyo; Tsuneo Taki, Hakui; Yasuhiro Tsuino, Nagaokakyo, all of Japan

[73] Assignee: Murata Manufacturing Co., Ltd., Japan

[21] Appl. No.: 736,183

[22] Filed: Oct. 27, 1976

[30] Foreign Application Priority Data

Oct. 29, 1975 Japan .................................. 50-130787

[51] Int. Cl.² .............................................. B21F 45/00
[52] U.S. Cl. ........................................ 140/1; 29/33 F; 72/DIG. 10; 140/105
[58] Field of Search ............. 140/1, 105; 72/DIG. 10; 29/33 F

[56] References Cited

U.S. PATENT DOCUMENTS

| | | | |
|---|---|---|---|
| 2,860,686 | 11/1958 | Frank et al. | 72/DIG. 10 |
| 3,653,412 | 4/1972 | Gudmestad | 140/1 |
| 4,003,413 | 1/1977 | Hanson et al. | 140/1 |

Primary Examiner—Z. R. Bilinsky
Attorney, Agent, or Firm—Wenderoth, Lind & Ponack

[57] ABSTRACT

A fixing device for shaping lead wires of a radial type electronic component which extend outwardly in a direction parallel to each other from the main body of the component into a shape similar to the wires of an axial type electronic component which extend outwardly in opposite directions from each other and for successively fixing the electronic components with the thus shaped lead wires onto tape-like holders for feeding the same into a known automatic inserting machine for use in making a printed circuit assembly.

2 Claims, 12 Drawing Figures

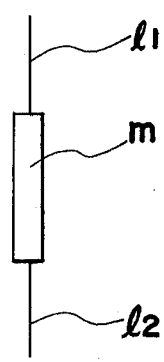
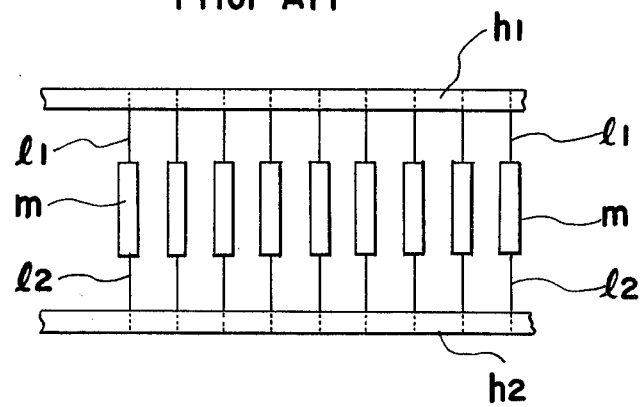
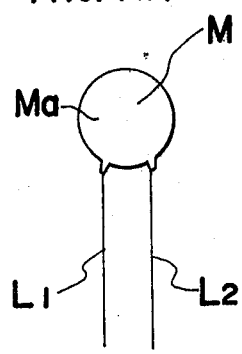
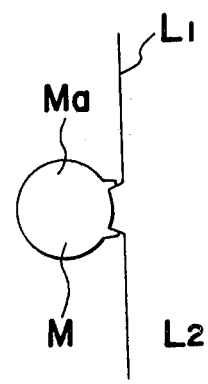
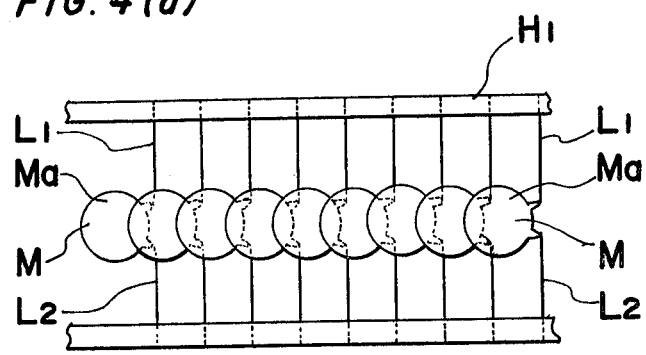
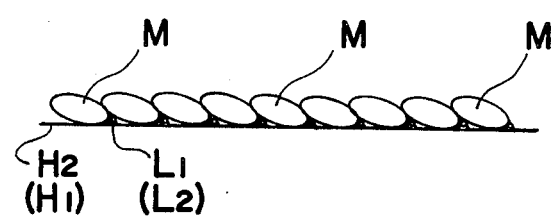
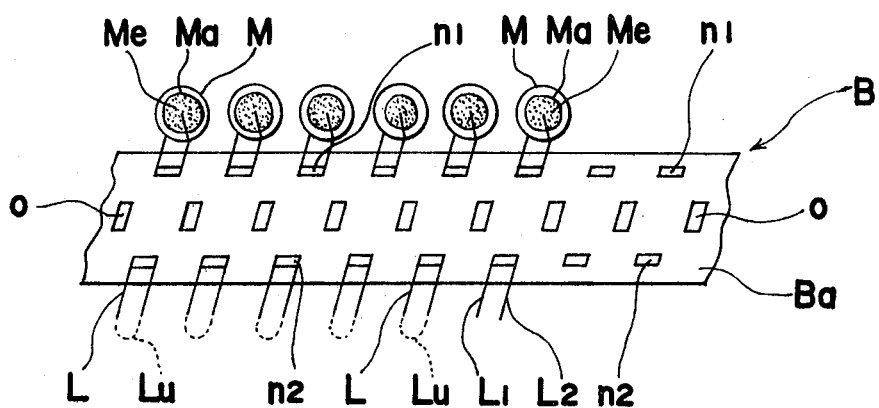

FIXING DEVICE FOR ELECTRICAL AND ELECTRONIC COMPONENTS

The present invention relates to electrical and electronic parts or components and more particularly, to a fixing device for successively fixing a plurality of electronic parts or components such as resistors, capacitors and the like onto tape-like holders or mounts.

Currently, electrical and electronic apparatuses are generally assembled by the use of printed circuit bases or substrates, and a large amount of labor can be saved if such components are inserted into the printed circuit bases by automatic inserting machines. Referring to the drawings, for electronic components such as capacitors, resistors and the like each having lead wires $l1$ and $l2$ which extend axially outwardly from opposite ends of a main body $m$ as shown in FIG. 1 (referred to as the axial type hereinbelow), there has conventionally been proposed an arrangement wherein a plurality of such axial type electronic components are fixed on a pair of tape-like holders $h1$ and $h2$ as shown in FIG. 2 for feeding into a known automatic insertion apparatus (not shown).

On the other hand, however, electronic components, for example, ceramic capacitors M each having lead wires L1 and L2 which extend outwardly in parallel relation to each other from a main body Ma as shown in FIG. 3(a) (referred to as the radial type hereinbelow) can not be fed, as they are, into the known automatic inserting machines unless the parallel lead wires L1 and L2 thereof are shaped to extend away from each other in directions normal to the parallel direction so as to lie in a straight line as seen in FIG. 3(b) and then arranged on the pair of tape-like holders H1 and H2 as shown in FIG. (4) in a manner similar to that for the axial type components (FIG. 2). Referring to FIG. 5, commonly in the manufacture of radial type electronic components, for example, the radial type ceramic capacitors M as described above, a plurality of U-shaped conductor wires L are each inserted into a corresponding pair of rectangular openings, nicks or the like $n1$ and $n2$ formed in a base or mount Ba of a resilient component holder B in a direction normal to the longitudinal direction of said base Ba, and the capacitor main bodies or elements Ma each having electrodes Me are held between the free ends of the U-shaped wires L for subsequent soldering of the elements Ma to said ends of the wires L and dipping of the elements Ma thus soldered to the wires L into a suitable liquid dielectric material to coat the elements Ma thereby, and thereafter, each of the U-shaped ends Lu (shown by dotted lines in FIG. 5) of the wires L is cut off to form the pair of parallel lead wires L1 and L2 extending outwardly in parallel relation to each other from the elements Ma. Although the construction of the holders may differ from the resilient component holder B as described above depending on the processes of manufacturing, such electronic components of the radial type are ordinarily produced as finished goods mounted in large numbers on holders of some type or other similar to that as described above. There is a strong demand in this industry for a device for shaping the lead wires of the radial type electronic components mounted on such holders into a shape similar to the shape of the lead wires of the axial type of component tape-like holders as shown in FIG. 4(a) so they can be fed into the known automatic inserting machine the same as the axial type components.

Accordingly, an essential object of the present invention is to provide a fixing device for successively fixing a plurality of electrical and electronic components onto tape-like holders and which is capable of shaping parallel lead wires of radial type electronic components into a shape similar to those of axial type electronic components so that the thus shaped components can be successively mounted on the tape-like holders for being fed to an automatic inserting machine.

Another important object of the present invention is to provide a fixing device of the above described type which functions accurately and can readily be introduced into present manufacturing processes of electrical and electronic apparatuses.

A further object of the present invention is to provide a fixing device of the above described type which has a simple construction and can be manufactured at low cost.

According to a preferred embodiment of the present invention, the fixing device is arranged to shape lead wires of radial type electronic components into a shape similar to those of the axial type and to successively fix thus shaped electronic components onto tape-like holders for feeding the same into an automatic inserting machine the same as axial type components, and includes means for feeding, in one direction, a resilient component holder on which a plurality of radial type electronic components are mounted, means for sequentially removing the radial type components from the component holder, means for shaping lead wires of the radial type components into a shape similar to those of the axial type components, means for stretching the thus shaped lead wires to form a straight line, and means for mounting the ends of the thus stretched lead wires onto a pair of continuous tape-like holders which are in spaced parallel relation to each other, with the lead wires of the plurality of electronic components being arranged in regular order and directed in a predetermined direction on said pair of tape-like holders. By the above arrangement, the radial type electronic components having parallel lead wires and mounted on the component holder are converted to electronic components having the axial type lead wires which extend outwardly away from each other in a straight line and conveniently mounted on the pair of tape-like holders, and thus electronic components of the radial type can be inserted into printed circuit base by the automatic inserting machines which are designed for handling the axial type components.

Figure 7A:
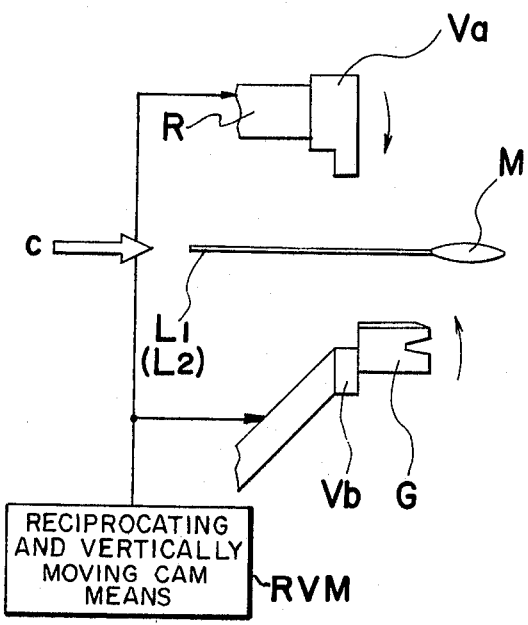
Figure 7B:
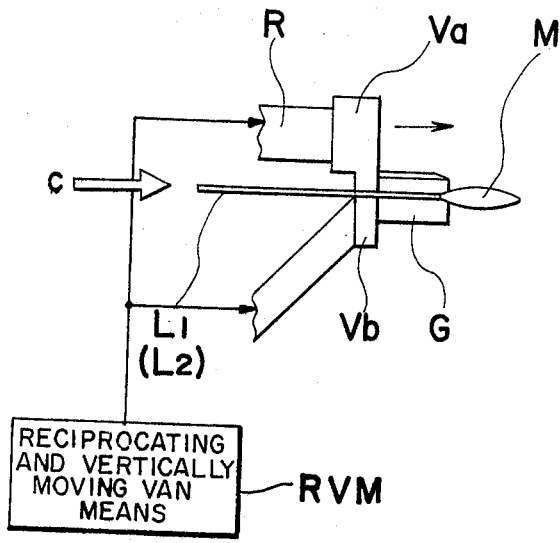
Figure 8:
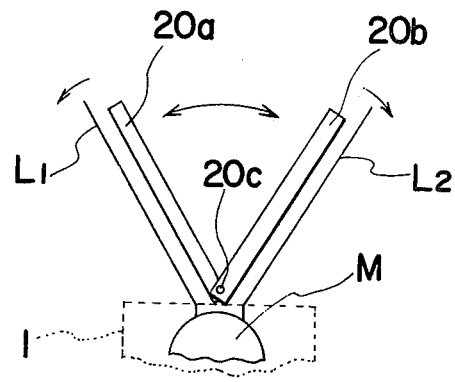
Figure 9:
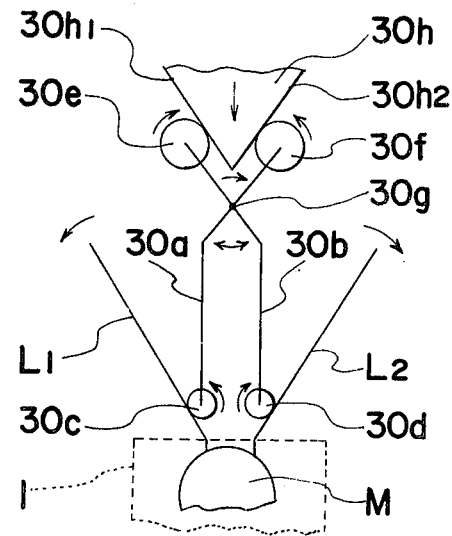

These and other objects and features of the present invention will become apparent from the following description taken in conjunction with the preferred embodiment thereof with reference to the attached drawings in which;

FIG. 1 is a schematic side view showing, on an enlarged scale, the construction of a known electronic component of the axial type, FIG. 2 is a fragmentary top plan view of tape-like holders holding thereon the axial type electronic component of FIG. 1 which has already been referred to, FIG. 3(a) is a schematic side view showing, on an enlarged scale, the construction of a known electronic component of radial type, FIG. 3(b) is a view similar to FIG. 3(a), but particularly shows lead wires of the electronic component bent outwardly to lie a straight line by the use of a fixing device according to the present invention, FIG. 4(a) is a fragmentary top plan view of tape-like holders holding thereon the electronic component with the lead wires shaped as in FIG. 3(b) by the fixing device of the present invention, FIG. 4(b) is a side elevational view of the tape-like holders of FIG. 4(a), FIG. 5 is a schematic perspective view of a component holder holding thereon electronic components to be processed by the fixing device according to the present invention, FIG. 6 is a perspective view showing an arrangement of the fixing device according to the present invention, FIG. 7(a) is a fragmentary side view of chuck and guide arrangement employed in the fixing device of FIG. 6 showing the chucks in spaced position, FIG. 7(b) is a similar view to FIG. 7(a), but particularly shows the chucks in the closed position, FIG. 8 is an elevation view of a modification of a lead wire shaping mechanism employed in the device of FIG. 6, and FIG. 9 shows another modification of the lead wire shaping mechanism employed in the device of FIG. 6.

Before the description of the present invention proceeds, it is to be noted that like parts are designated by like reference numeral throughout the several views of the accompanying drawings.

Referring to FIGS. 6 to 7(b), there is shown in FIG. 6 an arrangement of the fixing device according to one embodiment of the present invention. The component holder B having the tape-like configuration described earlier includes the base Ba, for example, of paper, metal or resilient canvas which is cut into a strip of predetermined size, or which is wound into a roll form (not shown), the base Ba having a pair of opposed rectangular openings n1 and n2 formed at regular intervals adjacent opposite edges of the base Ba in a direction normal to the longitudinal direction of the base Ba, and a plurality of rectangular feeding slits or perforations O also formed at regular intervals in the central portion of the base Ba in the axial direction thereof and lying between the openings n1 and n2. In the embodiment of FIG. 6, the lead wires L1 and L2 of the radial type ceramic capacitors M are respectively inserted into the corresponding pairs of openings n1 and n2, and thus the capacitors M are normally held tightly on the base Ba by the elasticity of the lead wires L1 and L2 and the base Ba so that they will not readily fall off the base Ba. The component holder B is fed in the direction of the arrow "a" at a predetermined speed by the engagement of the slits O thereof, for example, with a known ratchet drive means RD.

Still referring to FIG. 6, in a position adjacent to the path of the holder B, there is disposed a rotary member or drum rotatably supported, for example, by a shaft Ds suitably journalled in the frames (not shown) of the device for rotation in the direction of the arrow "b" by a suitable driving means (not shown). On the outer periphery of the drum D, a plurality of holding member 1 are disposed at regular intervals, each of which holding members 1 is provided with a set of opposed movable claws or jaws 1a and 1b that can be selectively engaged with and spaced from each other for holding the main body Ma of the ceramic capacitor M therebetween in a manner as described hereinbelow. When one of the capacitors M reaches a predetermined position as the holder B is fed in the direction of the arrow "a", the particular capacitor M is withdrawn from the holder B in the direction of the arrow "c" by removing means shown in FIGS. 7(a) and 7(b), and is subsequently held between a pair of the jaws 1a and 1b of the holding member 1 which has reached a position confronting the removing means.

Referring also to FIGS. 7(a) and 7(b), the removing means for removing the electronic components, i.e., the capacitors M in this case, from the holder B includes chucks Va and Vb movably provided at one end of rod member R which is adapted to selectively move vertically and reciprocate horizontally, for example, by cam means RVM, and a guide member G fixedly provided adjacent to the forward end of the chuck Vb. For withdrawing the capacitor M from the holder B, the guide G is first inserted between the lead wires L1 and L2 for sidewise positioning thereof as the chucks Va and Vb are moved toward each other in the directions indicated by full line arrows in FIG. 7(a), and thereafter, the lead wires L1 and L2 are held between the chuck Va and Vb for positioning in the vertical direction. Subsequently, the chucks Va and Vb holding the capacitor M therebetween are moved together with the guide G in the direction of the arrow "c" by movement of the rod member R and then moved apart release the capacitor M in a position adjacent to the holding member for inserting said capacitor M into the holding member 1 the jaws 1a and 1b of which are then spaced from each other in timed relation to the movement of the rod member R, for example, by cam means (not shown). It is to be noted here that the removing means for removing the electronic components M from the holder B and inserting the same into the holding member 1 which has reached the position confronting the removing means is not limited in its construction to that described with reference to FIGS. 7(a) and 7(b), but the upper chuck Va described as employed in the arrangement of FIGS. 7(a) and 7(b) may be dispensed with. Similarly, the lower chuck Vb may further be provided with suction holes (not shown) communicated with suitable vacuum means (not shown) for holding the electronic parts M thereon by vacuum pressure.

Referring back to FIG. 6, the holding member 1 holding the capacitor M therein is moved in the direction of the arrow "b" as the drum D rotates clockwise, and while the same operation as described above is repeated, the ceramic capacitors M are sequentially inserted into the subsequent holding members 1. In cases where the holder B is replaced by an adhesive tape or the like (not shown), the removing means of FIGS. 7(a) and 7(b) may further be provided with means for separating the capacitors M from such adhesive tape.

The lead wires L1 and L2 of the capacitor M extending in parallel relation from the main body Ma and held in the holding members 1 in the above described manner are subsequently spread outwardly to a certain extent so as to be in a V-shape when the same lead wires pass, following the clockwise rotation of the drum D, side walls 2a and 2b of a tapered member 2 fixedly disposed above the path of the holding members 1 by suitable supporting member (not shown), and are further bent outwardly by depressing means such as a punch or the like DM moving downwardly in a direction shown by an arrow "d", so that the lead wires L1 and L2 initially extending in parallel relation to each other from the main body Ma are directed in a direction normal to the initial parallel direction so as to lie in an approximate straight line as shown.

Referring also to FIGS. 8 and 9, it should be noted that the shaping mechanism for the lead wires L1 and L2 is not limited to the above embodiment, but a pair of shaping plates 20a and 20b pivoted to each other at corresponding end portions thereof adjacent to the bending portions of the lead wires L1 and L2 may be employed as shown in the modification of FIG. 8 so that the lead wires L1 and L2 are spread out into the straight line as the shaping plates 20a and 20b are rotated to open about a pivotal point 20c. In FIG. 9 showing another modification of the shaping mechanism of FIG. 6, the tapered member 2 and the punch DM described as employed in the mechanism of FIG. 6 are replaced by a pair of shaping rods 30a and 30b crossing each other and pivoted at a point 30g for selective opening and closing about the point 30g. At the lower ends of the shaping rods 30a and 30b, rollers 30c and 30d are rotatably mounted for contact with the corresponding lead wires L1 and L2, while similar rollers 30e and 30f are also rotatably disposed at the upper ends of the rods 30a and 30b for engagement with side walls 30h1 and 30h2 of a wedge-like member 30h which is adapted to move vertically in FIG. 9 suitable driving means (not shown). Upon downward movement of the wedge-like member 30h with the side walls 30h1 and 30h2 thereof contacting the corresponding rollers 30e and 30f, the shaping rods 30a and 30b are depressed downwardly and distance between the rollers 30c and 30d increases as the rods 30a and 30b are pivoted away from each other about the pivotal point 30g, and consequently the lead wires L1 and L2 are bent outwardly by the rollers 30c and 30d.

Referring back to FIG. 6, the capacitors M the lead wires L1 and L2 of which are shaped in the above described manner are sequentially released from the holding members 1 as the jaws 1a and 1b are moved away from each other to open, and subsequently placed onto a moving conveyor 3 at regular intervals with the lead wires L1 and L2 thereof being supported by a pair of spaced and parallel belts or chains 3a and 3b of the conveyor 3. Since it is rather difficult for the lead wires L1 and L2 bent in the above described manner to form a perfect straight line, there are further provided, in the embodiment of FIG. 6, a pair of spaced stretching rollers 4a and 4b rotatably mounted on the belts 3a and 3b of the conveyor 3, which rollers 4a and 4b are rotated in the direction indicated by the arrows by suitable driving means (not shown). As the capacitors M are transported, following the advancement of the conveyor 3, in the direction shown by an arrow "f", the lead wires L1 and L2 held between the respective rollers 4a and 4b and corresponding support plates P disposed below the rollers 4a 4b are subjected to rotation as the rollers 4a and 4b rotate for being stretched to form a straight line. The ceramic capacitors M of the radial type the lead wires L1 and L2 of which are shaped into a shape which is the same as the lead wires of the axial type elements in the above described manner are successively fixed onto the pair of tape-like holders H1 and H2 described earlier with reference to FIG. 4(a), For the holders H1 and H2, four pieces of single-sided adhesive tapes H1a, H1b, H2a and H2b are employed for holding the ends of the lead wires L1 and L2 between two pieces of the adhesive tapes H1a and H1b, and H2a and H2b respectively as shown in FIG. 6. In this case, the ceramic capacitors M are mounted on the holders H1 and H2 in such a manner that the main bodies Ma thereof are arranged so as to partly overlap one another at a predetermined angle as is most clearly seen in FIGS. 4(a) and 4(b). The above described arrangement may be achieved by raising the main bodies Ma of the capacitors M by 90° after said main bodies Ma have passed the rollers 4a and 4b in FIG. 6, for which purpose, there is provided a curved posture control member 5 so disposed between the belts 3a and 3b as to block the path along which the main bodies M move. When the main bodies Ma sequentially contact the posture control member 5 as the capacitors M are transported, they are raised or rotated through 90° about the lead wires L1 and L2, and with the capacitors M in the position, the adhesive tapes are applied to the lead wires L1 and L2 in the above described manner. The tape-like holders H1 and H2 on which the ceramic capacitors M are thus fixed may be wound onto a drum (not shown) or accommodated in a casing (not shown) in a folded state, for example, in a zigzag manner for feeding into a known automatic inserting machine when necessary.

It is to be noted here that the construction of the tape-like holders H1 and H2 is not limited to that described with reference to FIG. 6, but may be modified in various ways. For example, each of the holders may be formed by a piece of single-sided adhesive tape or the tape may be constituted by metallic materials provided that the holders serve the purpose of holding the electronic components thereon so that these components can be smoothly fed into the automatic inserting machine.

It should also be noted here that, although the above embodiment is mainly described with reference to the radial type ceramic capacitors having a circular disc shape, the fixing device of the invention is not limited, in its application, to such ceramic capacitors along, but may be applicable to any other electrical and electronic components of the radial type, such as varistors, thermistors and the like.

Needless to say the concept of the present invention described with reference to small-sized electronic components in the foregoing embodiment is readily applicable to manufacturing and handling of large-sized electrical and electronic components in general.

Although the present invention has been fully described by way of example with reference to the attached drawings, it is to be noted that various changes and modifications will be apparent to those skilled in the art. Therefore, unless otherwise such changes and modifications depart from the scope of the present invention, they should be construed as included therein.

What is claimed is:

1. A fixing device for successively fixing a plurality of electronic components held on first holding means onto second holding means, which device comprises means for transporting, in one direction, the first holding means on which the plurality of electronic components are each held with the lead wires thereof extending outwardly in a direction parallel to each other from the main body of the electronic component, removing means adjacent the path of transport of said first holding means for sequentially removing the electronic components from said first holding means, shaping means for receiving and holding the components from said removing means and shaping the lead wires of the thus removed electronic component held in said shaping means so that they are bent outwardly away from each other in directions normal to said parallel direction, stretching means for receiving components from said shaping means and stretching the thus shaped lead wires into a straight line, and means for successively mounting the electronic components having the thus stretched lead wires onto the second holding means, said electronic components being so arranged on said second holding means as to be directed in a predetermined direction, said shaping means including a rotatable drum member, a plurality of holding members disposed at regular intervals on the outer periphery of said rotatable drum member, each of said holding members having a pair of jaws which are movable back and forth from a position in which they are in contact to a position in which they are spaced from each other in timed relation to the movement of said removing means, a tapered member fixedly disposed adjacent said drum member after said removing means in the direction of rotation of said drum and radially outwardly of said holding members having outwardly diverging surfaces over which the lead wires of the electronic components are moved to diverge them into a V-shape as the electronic components held in said holding members move during rotation of said rotatable drum member, and depressing means movably disposed radially outwardly said drum member and after said tapered member in the direction of rotation of said drum for engaging the lead wires and further diverging them into approximately a straight line.

2. A fixing device for sucessively fixed a plurality of electronic components held on first holding means onto second holding means, which device comprises means for transporting, in one direction, the first holding means on which the plurality of electronic components are each held with the lead wires thereof extending outwardly in a direction parallel to each other from the main body of the electronic component, removing means adjacent the path of transport of said first holding means for sequentially removing the electronic components from said first holding means, shaping means for receiving and holding the components from said removing means and shaping the lead wires of the thus removed electronic component held in said shaping means so that they are bent outwardly away from each other in directions normal to said parallel direction, stretching means for receiving components from said shaping means and stretching the thus shaped lead wires into a straight line, and means for successively mounting the electronic components having the thus stretched lead wires onto the second holding means, said electronic components being so arranged on said second holding means as to be directed in a predetermined direction, said shaping means including a pair of shaping rod members adjacent the position of the lead wires of said components as they are held in said shaping means, said rod members crossing each other and pivoted to each other at the intersection therebetween, said shaping rod members having at the ends thereof adjacent to the lead wires first rotatable rollers for contacting the lead wires, the other ends of said shaping rod members remote from said firstmention ends having second rotatable rollers thereon, and a wedge-like member reciprocally movable between said second rotatable rollers for urging them apart and out from between said second rotatable rollers.

* * * * *